United States Patent [19]

Takasaki et al.

[11] Patent Number: 4,457,949
[45] Date of Patent: Jul. 3, 1984

[54] METHOD OF PRODUCING A PHOTOELECTRIC CONVERSION LAYER

[75] Inventors: Yukio Takasaki, Hachioji; Yasuharu Shimomoto, Nishitama; Yasuo Tanaka, Kobubunji; Akira Sasano, Nishitama; Toshihisa Tsukada, Nerima, all of Japan

[73] Assignee: Hitachi, Ltd., Tokyo, Japan

[21] Appl. No.: 388,619

[22] Filed: Jun. 15, 1982

[30] Foreign Application Priority Data

Jun. 17, 1981 [JP] Japan .................................. 56-92300

[51] Int. Cl.³ .......................... B05D 3/14; B05D 5/12
[52] U.S. Cl. ...................................... 427/39; 313/384; 313/385; 427/86; 427/372.2
[58] Field of Search .................. 427/38, 39, 86, 372.2; 313/366, 384, 385

[56] References Cited

U.S. PATENT DOCUMENTS 4,255,686 3/1981 Maruyama et al. ................ 313/366

OTHER PUBLICATIONS

Yamamoto et al., "Proceedings of the 12th Conf. on Solid State Devices, Tokyo 1980" *Japanese Journal of Applied Physics*, vol. 20, (1981) Supplement 20-1, pp. 305-310.

Chittick et al., "J. Electrochem. Soc. Solid State Science", vol. 116, No. 1, Jan. 1969.

*Primary Examiner*—John H. Newsome
*Attorney, Agent, or Firm*—Antonelli, Terry & Wands

[57] ABSTRACT

A hydrogen-containing amorphous silicon layer is formed on a substrate held below 200° C., in a plasma atmosphere, whereupon the plasma is stopped and the layer is heated in a temperature range of 200° C.–400° C. without cooling the substrate. The saturation field for photocurrent of electrons or holes can be made low. In case of using electrons as major carriers, preferably the heating temperature is set in a temperature range of 200° C.–240° C., and in case of using holes as major carriers, preferably it is set in a range of 270° C.–400° C.

10 Claims, 10 Drawing Figures

METHOD OF PRODUCING A PHOTOELECTRIC CONVERSION LAYER

BACKGROUND OF THE INVENTION

1. Field of the Invention

The present invention relates to a method of producing a photoelectric conversion layer. Especially, it is very effective when applied to hydrogen-containing amorphous semiconductor layers for use in an image pickup tube, a solid-state imaging device, a photosensor, an electrophotographic plate, etc.

2. Description of the Prior Art

The photoelectric conversion layer as stated above needs to be favorable in the range of photo-generated carriers, i.e., the $\mu\tau$ product of carriers and high in resistivity, and to be free from defects etc.

As photoelectric conversion layers, there have heretofore been well known hydrogen-containing amorphous Si layers. By way of example, U.S. Pat. No. 4,255,686 discloses an image pickup device which employs such hydrogen-containing amorphous silicon layer. The amorphous Si layer is doped with hydrogen, and is produced with a plasma state by the glow discharge decomposition of $SiH_4$ or $Si_2H_6$, the reactive sputtering in a hydrogen atmosphere, or the like.

SUMMARY OF THE INVENTION

An object of the present invention is to provide a method of producing a photoconductive layer which is made of hydrogen-containing amorphous silicon and which exhibits improved photoconductive characteristics.

Especially in case of using the photoconductive layer in the storage mode, the producing method of the present invention is useful.

A second object of the present invention is to provide a method of producing a photoconductive layer which includes very little defects.

The present invention consists in forming a hydrogen-containing amorphous silicon layer on a substrate held at a temperature below 200° C., in a plasma atmosphere, and subsequently stopping the plasma and heating the layer in a temperature range of 200° C.–400° C. without cooling the substrate.

As expedients for forming the hydrogen-containing amorphous silicon layer on the substrate, the methods employing the plasma such as the method utilizing the glow discharge and the reactive sputtering method in the hydrogen atmosphere are applied as described before.

In forming the hydrogen-containing amorphous silicon layer, the substrate temperature is held below 200° C. In many cases, the substrate temperature is made at least 50° C., preferably at least 100° C. The reasons why the substrate temperature is held below 200° C., are as follows.

First, in operating a photoconductive layer in the storage mode, its resistivity needs to be at least $10^{10}$ $\Omega$.cm from the viewpoint of resolution. In this regard, it can more easily realize a high resistivity to hold the substrate temperature below 200° C. This phenomenon is particularly conspicuous in the hydrogen-containing amorphous silicon layer produced by the glow discharge method.

Secondly, the effects of improvements in the photoconductive characteristics are more remarkable in the case where the substrate temperature is held below 200° C.

Accordingly, the photoconductive layer suitable for use in the storage mode can be obtained by holding the substrate temperature below 200° C. and performing the heat treatment as in the present invention.

In this case, a saturation field for photocurrent of electrons can be made low(ie. the range of electrons ($\mu_e\tau e$) can be made high) by specifically setting the temperature of the heat treatment in a range of 200° C.–240° C. On the other hand, a saturation field for photocurrent of positive holes can be made low(ie. the range of holes ($\mu_h\tau h$) can be made high) by specifically setting the heat treatment temperature in a range of 270° C.–400° C.

The period of time of the heat treatment is selected in a range of 5 minutes–40 minutes, preferably 10 minutes–40 minutes. When the heat treatment time is too long, unfavorably the layer is damaged or the hydrogen separates away.

DETAILED DESCRIPTION OF THE PREFERRED EMBODIMENTS

Figure 1:
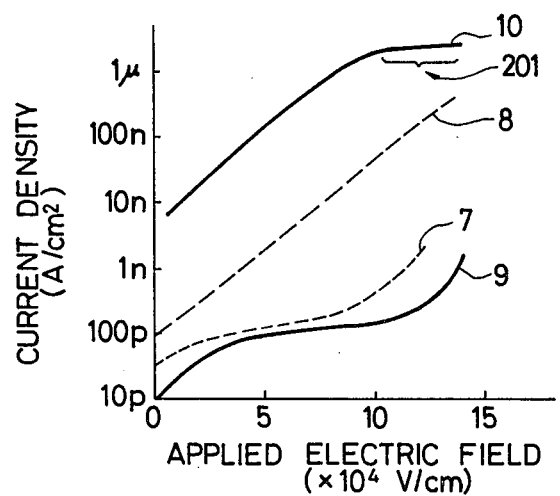
FIG. 1 is a graph of the schematic characteristics of photoelectric conversion layers formed by the present invention.

In the process of production according to the present invention, in depositing a silicon layer by the use of a plasma, a substrate is heated at a temperature of below 200° C., and after the deposition of the layer, the heating temperature is raised to 200°–400° C. without cooling the substrate, whereby either electrons or holes can be used as good photo-carriers. This is based on the fact that, by performing the heat treatment at the temperature higher than the layer forming temperature without cooling the deposited amorphous silicon layer, carrier trap levels in the layer are reduced, so photo-generated carriers can travel sufficiently even in a low electric field. When the substrate temperature during the formation of the layer is not lower than 200° C., unfavorably the effects of improvements in the photoconductive characteristics as attained by the subsequent heat treatment are little. In addition, when the temperature of the heat treatment is lower than 200° C., unfavorably the value $\mu\tau$ affecting the photoconductivity is scarcely improved. Accordingly, a saturation field suitable for practical use cannot be attained. In the above, $\mu$ denotes the mobility of the carriers, and $\tau$ the lifetime of the carriers. Further, when the heat treatment temperature is higher than 400° C., unfavorably the hydrogen in the layer separates away, to increase defects or to narrow the forbidden band gap $E_g$, resulting in such drawback that the spectral characteristics shift greatly onto the longer wavelength side. In, for example, an image pickup device for the visible radiation region, the shift of the spectral characteristics onto the longer wavelength side necessitates an infrared filter, resulting in such problems as degradation in the sensitivity in the wavelength region of use and increase in the scale of the image pickup device.

The details of the relationship between the saturation field and the heat treatment will be described later. Here, the relation between the substrate temperature during the formation of the amorphous silicon layer and the defect occurrence rate will be referred to. Table 1 indicates this relation. In evaluating the defect occurrence rate, a sample in which at least one defect occurred per cm² thereof was judged defective, and a sample in which the number of defects was less than one per cm² thereof was judged nondefective.

The heat treatment after the deposition of the layer was started immediately after the formation of the layer upon stopping the plasma.

TABLE 1

| Substrate Temperature during Deposition of Layer (°C.) | Heat Treatment after Deposition of Layer | | Defect Occurrence Rate (%) |
| --- | --- | --- | --- |
| | Heating Temp. (°C.) | Time (min) | |
| 100 | 230 | 20 | 25 |
| 150 | 230 | 20 | 23 |
| 180 | 230 | 20 | 26 |
| 190 | 230 | 20 | 26 |
| 210* | 230 | 20 | 75 |
| 230* | 235 | 20 | 78 |

*Comparative Examples

The above result was obtained as to the samples in each of which a hydrogen-containing amorphous silicon layer was formed on a glass substrate to a thickness of 3 μm by the reactive sputtering.

It is understood from the result that, in forming the amorphous silicon layer, the substrate temperature ought to be held below 200° C.

Further, Table 2 indicates the relation between a heat cycle after the formation of the amorphous silicon layer and the defect occurrence rate.

TABLE 2

| Substrate Temp. during Deposition of Layer (°C.) | Presence or Absence of Heat Cycle | Heats Treatment after Deposition of Layer | | Defect Occurrence Rate (%) |
| --- | --- | --- | --- | --- |
| | | Heating Temp. (°C.) | Time (min) | |
| 100* | Present | 230 | 20 | 81 |
| 150* | " | 230 | 20 | 78 |
| 180* | " | 230 | 20 | 75 |
| 190* | " | 230 | 20 | 76 |
| 100 | Absent | 230 | 20 | 25 |
| 150 | " | 230 | 20 | 23 |
| 180 | " | 230 | 20 | 26 |
| 190 | " | 230 | 20 | 26 |

*Comparative Examples

Each sample indicated as "heat cycle present" was obtained in such a way that, after forming the layer, the substrate was once cooled, that the interior of a sputtering equipment was evacuated into vacuum, and that the heat treatment was subsequently performed. On the other hand, each sample indicated as "heat cycle absent" was the same as in Table 1.

It is understood from the result that the presence or absence of the heat cycle has great influence on the quality of the layer.

As regards the procedure that immediately after the formation of the layer, the heat treatment is carried out upon stopping the plasma; it was feared that the gaseous atmosphere for generating the plasma might affect the quality of the layer adversely. It has been confirmed, however, that the procedure has quite no influence.

Moreover, according to the present invention, appropriate carriers can be selected in conformity with the direction of the incidence of light on the photoelectric conversion layer and the sense of an applied electric field. Therefore, a layer having the optimum photoconductive property can be obtained on occasion. This can be clearly convinced of by comparing the characteristics of respective layers during the formation and after the formation thereof. FIG. 1 shows the relationship between the applied electric field and the current density of a photoconductive layer. As an example is shown by a curve 10 in FIG. 1, the photo current of a Si layer produced by the present invention has a saturation region 201 in the applied electric field-current density characteristics with a boundary at $10 \times 10^4$ V/cm. In the operation of a device employing the photoelectric conversion layer, the saturation region exhibits a constant current density value in spite of the variation of the applied electric field, and it is very effective for retaining stability. For the sake of comparison, the characteristics of a sample in which merely a layer was formed are shown at a broken line 8. The layer of the broken line 8 having no saturation region is very unstable with any applied electric field, and is not easily used. On the other hand, the difference between the values of dark current and photo current became great, so that photoelectric conversion layers of very good sensitivity could be produced. Regarding the dark current, a broken line 7 indicates the characteristics of a sample in which merely a layer was formed, and a solid line 9 indicates those of a sample which was subjected to the heat treatment of the present invention. The temperature of the heat treatment in FIG. 1 was 250° C. Samples heat-treated at 200°–400° C., similarly exhibited characteristics having saturation regions at low electric fields.

Figure 2:
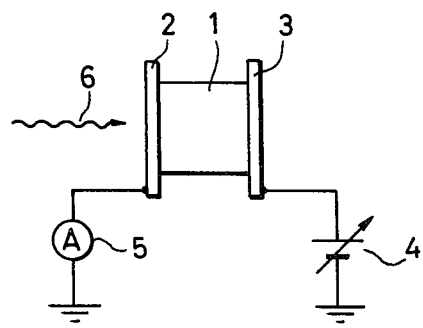
FIG. 2 is a diagram of a measuring circuit used in the assessment of photoelectric conversion layers.

FIG. 2 is a shematic diagram of a circuit which was used for measuring the characteristics of layers. In the figure, numeral 1 designates an amorphous Si layer, numerals 2 and 3 semitransparent electrodes, numeral 4 a power source, and numeral 5 an ammeter. The characteristics obtained are as illustrated in FIG. 1. The dark current characteristics 7 and 9 were measured with the circuit arrangement by putting the samples in a dark place. The photo current characteristics 8 and 10 were obtained by measuring the voltage-current characteristics of the samples when they were exposed to light 6 of a short wavelength (450 nm).

As described above, owing to the heat treatment of the present invention, the dark current is suppressed up to a high electric field, and the photo current is greatly increased, so that the saturation region is formed at a lower electric field. This is as indicated by the example in FIG. 1. The reason is that carrier trap levels within the layer decreased, so photo-generated carriers became capable of traveling sufficiently even at the low electric field. Such heat-treatment effects were obtained and were similar with any atmospheres for heat treatments as long as they include no plasma state. Of course, it is important that the temperature range of the heat treatment after the formation of the layer is set at the range of 200°–400° C. The reasons will now be described.

Figure 3A:
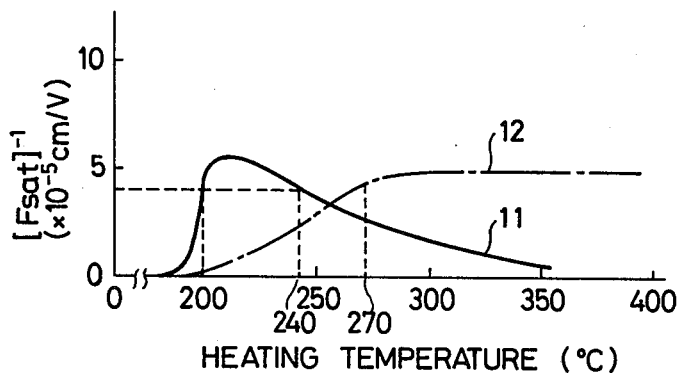
FIGS. 3a and 3b are graphs of the characteristics of different photoelectric conversion layers formed by the present invention.
Figure 3B:
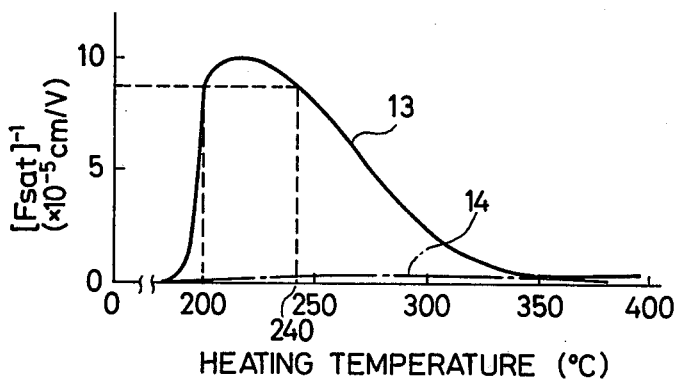

FIGS. 3a and 3b show the saturation field ($F_{sat}$)-heat treatment temperature (°C.) characteristics of amorphous Si layers produced by the present invention.

In FIG. 3a, a solid line 11 indicates the result in the case where electrons were used as major photo-carriers, that is, where the light incidence side of the layer was negatively biased in operation, while a dot-and-dash line 12 indicates the result in the case where holes were used as major photo-carriers, that is, where the light incidence side was positively biased in operation. FIG. 3b concerns the sample of amorphous Si whose range for electrons was improved by doping it with nitrogen (N) or oxygen (O). A solid line 13 indicates the result on electrons, while a dot-and-dash line 14 indicates the result on holes. The samples illustrated in FIG. 3b were prepared so that holes might not become carriers. As a matter of course, accordingly, the range of holes is not greatly changed by the heat treatment. As apparent from FIGS. 3a and 3b, in the case of using electrons as the major photo-carriers, the heat treatment temperature should desirably lie in a range of from 200° C. to 240° C., while in the case of using holes, it should desirably lie in a range of from 270° C. to 400° C. This is because the Fermi level shifts toward the valence band as the heat treatment temperature rises. However, any improvement in the range of holes is not noted in the amorphous silicon layer having undergone the heat cycle.

In the construction of usage wherein a transparent electrode is disposed on the amorphous Si layer and wherein light is entered therethrough, when the photo-carriers are electrons, semitransparent Au, Pt, Te or Pd having a work function greater than 4.5 eV is evaporated on the Si layer, and it is negatively biased in operation. On the other hand, when the photo-carriers are holes, it is more favorable that an $In_2O_3$ film or a film of Al having a work function smaller than 4.2 eV is formed on the Si layer by sputtering or evaporation and that it is positively biased in operation. Quite the same applies to a case where the amorphous Si layer is disposed on an electrode.

Furthermore, according to the present invention, the heat treatment of the substrate is carried out subsequently to the formation of the Si layer, so that defects are introduced into the layer very little by the heat cycle. When the layer had its temperature lowered once after the formation thereof and then the heat treatment was conducted, the nondefective rate was only about 30%, whereas it could be made about 80% in accordance with the present invention. The reason is that, since any heat cycle due to a temperature fall or a temperature rise is not undergone, the Si layer formed is not subjected to any heat fatigue. Hereunder, the invention will be described in detail in connection with embodiments.

EMBODIMENT 1

The present embodiment is an example in which the invention is applied to the photosensitive surface of a solid-state imaging device.

Figure 4A:
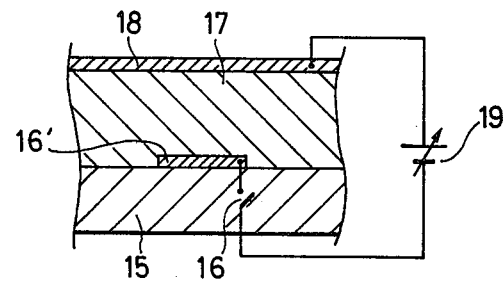
FIGS. 4a to 4c are a model diagram, a principle arrangement diagram and a sectional view of the essential portions of a solid-state imaging device applying the present invention, respectively.
Figure 4B:
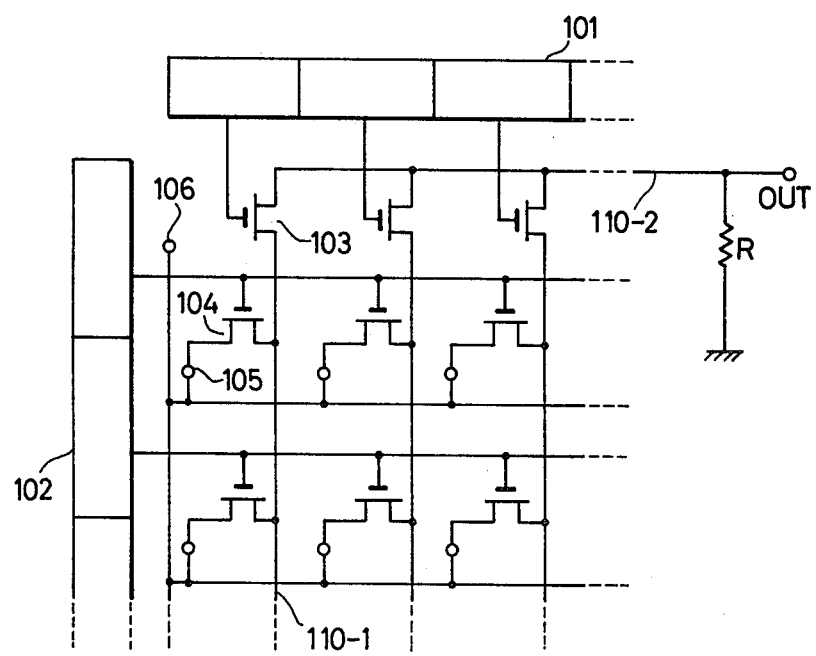
Figure 4C:
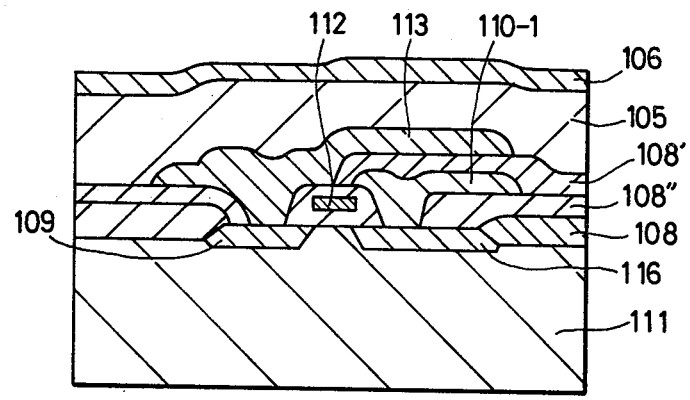

FIGS. 4a–4c are a model diagram, a principle circuit arrangement diagram and a sectional view of the solid-state imaging device having a structure in which a scanning circuit portion and a photoelectric conversion portion are stacked. An example of this solid-state imaging device is so constructed that only scanning circuits and a group of switches 16 connected thereto are arrayed on a semiconductor substrate and that a photoconductive layer 17 for the photoelectric conversion function is formed thereon. In FIG. 4a, numeral 15 designates the IC substrate, numeral 18 a transparent electrode, symbol 16' an electrode connected to the switch 16, and numeral 19 a power source. Owing to the double-layered structure in which the photoelectric conversion elements are formed on the scanning circuits and the group of switches, the degree of integration of picture elements (i.e., the resolution) and the light receiving efficiency become higher, and hence, the device is expected as a solid-state imager in the future. An example of the solid-state imaging device of this type is disclosed in Japanese Laid-open Patent Application No. 51-10715 (filed July 5, 1974). FIG. 4b shows an arrangement for explaining the principle of the device. Referring to the figure, numeral 101 indicates a horizontal scanning circuit which turns "on" and "off" horizontal position selecting switches 103, numeral 102 a vertical scanning circuit which turns "on" and "off" vertical position selecting switches 104, numeral 105 the photoelectric conversion element which utilizes the photoconductive layer, numeral 106 a supply voltage terminal for driving the photoelectric conversion elements 105, symbols 110-1 and 110-2 signal output lines, and symbol R a resistor. FIG. 4c shows the sectional structure of a photoelectric conversion region in FIG. 4b, and numeral 105 indicates the photoconductive layer, numeral 106 a transparent electrode and symbols 108, 108' and 108" insulating films. In addition, numeral 111 indicates the semiconductor substrate, numeral 112 a gate electrode, and numeral 113 an electrode (of, e.g., Al) which is held in ohmic contact with one end 109 (a diffusion region formed of an impurity opposite in the conductivity type to the substrate 111) of the switch 104. When an optical image is focused on the photoconductive layer through a lens, the resistance value of the photoconductive layer changes according to the light intensity of the optical image, a voltage variation corresponding to the optical image appears at one end 109 of the vertical switch 104, and the variation component is derived as an image signal from an output terminal OUT through the signal output lines 110-1 and 110-2 (refer to FIG. 4b). Shown at numeral 116 is a diffused region of an impurity identical in the conductivity type to the region 109 as is connected to the signal output line 110-1.

Since the concrete fundamental structure of the present example is as shown in FIG. 4c, reference is had to this figure. The scanning circuit portion of the switch circuits etc. formed on the semiconductor substrate is manufactured with the fabricating steps of ordinary semiconductor devices. A thin $SiO_2$ film of about 800 Å is formed on the p-type silicon substrate 111, and an $Si_3N_4$ film of about 1400 Å is formed on a predetermined position of the $SiO_2$ film. The $SiO_2$ film is formed by the conventional CVD process, and the $Si_3N_4$ film by a CVD process with $Si_3N_4$ and $N_2$ kept flowing. Subsequently, silicon is locally oxidized in an atmosphere of $H_2:O_2=1:8$ so as to form the $SiO_2$ layer 108. This method is the localized oxidation of silicon for isolating elements as is generally termed "LOCOS". The silicon layer is once formed of the aforementioned $Si_3N_4$ film and $SiO_2$ film.

Subsequently, the gate portion 112 of polycrystalline silicon and the diffused regions 109 and 116 are formed. Further, the $SiO_2$ film 108" is formed on the latter diffused region. In this film, an electrode lead-out opening for the impurity region 116 is provided by etching. As the electrode 110-1, Al is evaporated 8000 Å. Further, the SiO$_2$ film 108' is formed at 7500 Å, an electrode lead-out opening for the impurity region 109 is subsequently provided by etching, and Al or Mo is evaporated 1 μm as the electrode 113.

Next, the amorphous Si layer 105 is formed on the resultant sample by a magnetron type sputtering equipment. That is, the amorphous Si layer 105 is deposited on the Si scanning IC having the electrode 113 by the reactive sputtering process. This manufacturing process is as stated below. Ar under a partial pressure of $2.5 \times 10^{-3}$ Torr and H under a partial pressure of $5 \times 10^{-4}$ Torr are introduced into a reaction chamber evacuated to $10^{-7}$ Torr, whereupon the sputtering is carried out at a discharge power of 2 W/cm$^2$. At this time, the substrate temperature is made 180° C. After the amorphous Si has been deposited to a layer thickness of 4 μm by this method, the discharge is stopped, and the substrate temperature is immediately raised to 280° C. In this state, a heat treatment is performed for 20 minutes. Subsequently, the upper electrode 106 of ITO (In$_2$O$_3$-SnO$_2$) having a thickness of 800 Å is formed by the sputtering process. Then, the device is finished up.

This device is operated by applying a supply voltage with which the upper electrode 106 is positively biased. The connection of the power source is illustrated in FIG. 4a. Herein, there has been produced the solid-state imaging device which is operated by 8 V for the whole visible radiation region and in which the major photo-carriers are holes.

EMBODIMENT 2

Amorphous Si in the solid-state imaging device of the structure shown in Embodiment 1 is prepared under the following conditions by the reactive sputtering process. Ar under a partial pressure of $2.8 \times 10^{-3}$ Torr, H$_2$ under a partial pressure of $5 \times 10^{-4}$ Torr and N$_2$ under a partial pressure of $12 \times 10^{-6}$ Torr are introduced into a reaction chamber evacuated to $5 \times 10^{-7}$ Torr, and the amorphous Si having a layer thickness of 5 μm is deposited at a discharge power of 2 W/cm$^2$ and a substrate temperature of 190° C. Upon completion of the deposition, the discharge is stopped, and the substrate temperature is immediately raised to 215° C. without cooling the substrate. In this state, a heat treatment is performed for 30 minutes. On the resultant layer, a semitransparent Au electrode 200 Å thick is formed by the vacuum evaporation process. Then, the device is finished up.

This device is operated by applying a supply voltage with which the upper electrode is negatively biased. Herein, there has been produced the solid-state imaging device which is operated by 5 V for the whole visible radiation region and in which the major photo-carriers are electrons.

EMBODIMENT 3

Figure 5:
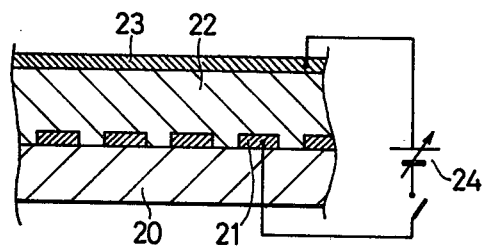
FIG. 5 is a schematic sectional view of a photosensor applying the present invention.

FIG. 5 is a schematic sectional view showing the concept of a linear photosensor which is another example applying the present invention. On a glass substrate 20 in which optical fibers (not shown) are buried, strip-like SnO$_2$ transparent electrodes 21 are formed by the CVD process. The bundles of optical fibers serve to transmit optical information. On the resultant substrate, an amorphous Si layer 22 is prepared under the following conditions by the glow discharge method. 10% of SiH$_4$ gas thinned with H$_2$ is introduced up to $10^{-1}$ Torr into a reaction chamber evacuated to $10^{-7}$ Torr, and amorphous Si having a layer thickness of 2.5 μm is deposited at a discharge power of 0.5 W/cm$^2$ and a substrate temperature of 195° C. Immediately after the stop of the discharge, the substrate temperature is raised to 230° C., and under the state, a heat treatment is performed for 20 minutes. Subsequently, an upper electrode 23 is formed to a thickness of 3000 Å by the electron-beam evaporation of Cr. Then, the linear photosensor is finished up.

This device is operated by 12 V in either case where the upper electrode 23 is biased positively or negatively by a supply voltage 24.

EMBODIMENT 4

There will be explained an example in which the method of producing a photoconductive layer according to the present invention is applied to the photoconductive layer of the target of an image pickup tube.

Figure 6:
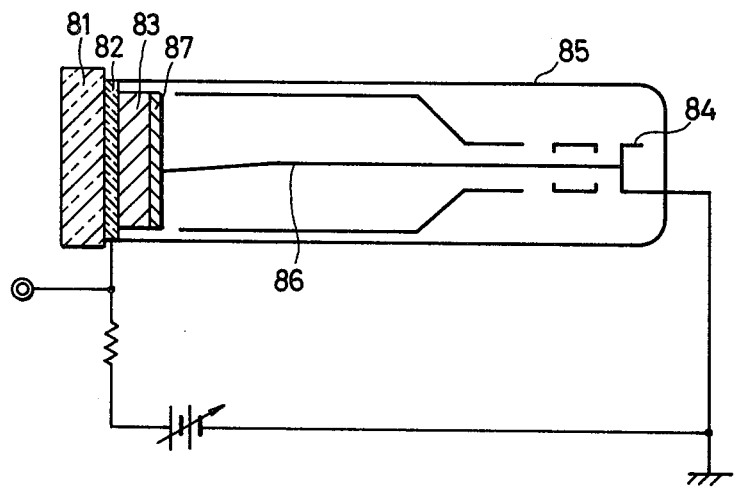
FIG. 6 is a schematic sectional view of the target of an image pickup tube applying the present invention.

FIG. 6 shows the structure of the image pickup tube.

As a typical example of a conventional photosensor operated in the storage mode, there is a photoconductive type image pickup tube. It is constructed of a light-transmitting substrate 81 usually called "faceplate", a transparent conductive film 82, a photoconductor layer 83, an electron gun 84 and an envelope 85. An optical image focused on the photoconductor layer 83 through the faceplate 81 is photoelectrically converted, to store it as a charge pattern in the surface of the photoconductor layer 83. The charge pattern is read in time sequence by a scanning electron beam 86.

The present invention is applied to the above photoconductor.

As the underlying substrate on which an amorphous silicon layer is deposited, there is used an optically-polished glass plate on which a transparent electrode of tin oxide or the like is disposed. Within a sputtering equipment, the substrate is set in a manner to face a silicon target of a raw material. The tin oxide is deposited by the known CVD process.

Figure 7:
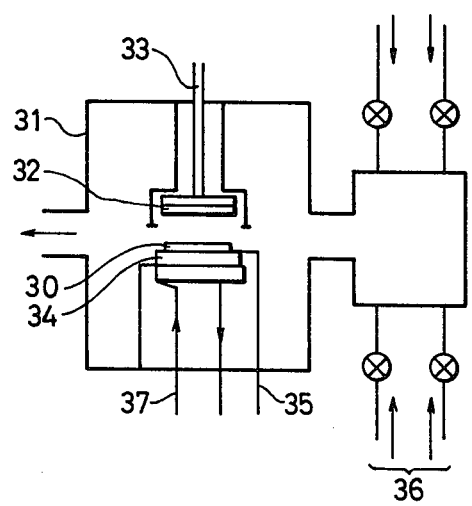
FIG. 7 is a view for explaining a sputtering equipment.

FIG. 7 is a schematic explanatory view of the sputtering equipment. Numeral 30 indicates a sample, numeral 31 a vessel which can be evacuated into vacuum, and numeral 32 the sputtering target which is a sintered compact of silicon or the like. Numeral 33 denotes an electrode for applying an r. f. voltage, numeral 34 a sample holder, numeral 35 a thermocouple for measuring a temperature, numeral 36 passages for introducing a rare gas such as argon and a gas such as hydrogen, and numeral 37 a passage for circulating cooling water. Using the sputtering equipment, the hydrogen-containing amorphous silicon layer is prepared by the reactive sputtering process in a gaseous mixture consisting of the rare gas and hydrogen.

As described before, the substrate temperature during the formation of the layer needs to be held below 200° C. The hydrogen content of the amorphous layer can be changed in such a way that, in the pressure $5 \times 10^{-4}$ Torr—$1 \times 10^{-2}$ Torr of the atmosphere during the discharge, the partial pressure of hydrogen is variously changed in a range of about 10%–70%. As the target for sputtering, the sintered compact of silicon is employed. If necessary, boron being a p-type impurity is added, or phosphorus being an n-type impurity is added. Further, a mixed sintered compact consisting of silicon and germanium, etc. can be employed.

First, the interior of the vessel 31 which can be evacuated into vacuum is evacuated to about $5 \times 10^{-8}$ Torr at which a residual gas is not influential. Thereafter, the mixed gas of hydrogen and argon is introduced to bring the interior of the vessel into a degree of vacuum on the order of $5 \times 10^{-4}$ Torr$-1 \times 10^{-2}$ Torr. The partial pressure of hydrogen is made 10%. When, under this state, a radio frequency power (frequency: 13.54 kHz) of about 300 W (2 W/cm$^2$) is applied to the target, the discharge occurs across the target and the substrate, and amorphous silicon is deposited on the substrate. In this case, the substrate temperature is made 185° C.

After the amorphous silicon layer about 3 μm thick has been deposited in this way, the discharge is stopped, and the substrate temperature is immediately raised to 300° C. Under this state, a heat treatment is performed for 15 minutes. Subsequently, using $3 \times 10^{-3}$ Torr of argon gas, antimony trisulfide is evaporated and formed to a thickness of 100 nm as a beam landing layer. A photosensitive surface thus formed was used as the photosensitive surface of a vidicon type image pickup tube. This photosensitive target operated at 7 V for the whole visible radiation region, and exhibited good imaging characteristics.

As set forth above, according to the present invention, a hydrogen-containing amorphous Si layer is heat-treated at a temperature higher than that during the formation of the layer, whereby the layer can be used as a good photoelectric conversion layer having no defect. In addition, both electrons and holes can be selected as major photo-carriers. Needless to say, the method of the invention is useful in the manufacture of all photoelectric conversion elements which include, not only the solid-state imaging device, the linear photosensor and the image pickup tube explained in the foregoing embodiments, but also an electrophotographic plate, a solar cell operated without applying an external electric field, etc.

What is claimed is:

1. A method of producing a photoelectric conversion layer comprising the steps of forming a hydrogen-containing amorphous silicon layer on a predetermined substrate in a plasma atmosphere at a substrate temperature below 200° C., subsequently stopping the plasma and then immediately heat-treating said hydrogen-containing amorphous silicon layer at 200° C.–400° C. without the presence of a heat cycle in which the substrate is cooled.

2. A method of producing a photoelectric conversion layer according to claim 1, wherein the heating step is carried out at a temperature of from 200° C. to 240° C.

3. A method of producing a photoelectric conversion layer according to claim 1, wherein the heating step is carried out at a temperature of from 240° C. to 400° C.

4. A method of producing a photoelectric conversion layer according to claim 1, 2 or 3, wherein the step of forming a hydrogen-containing amorphous silicon layer is carried out by a reactive sputtering in an atmosphere which contains at least hydrogen.

5. A method of producing a photoelectric conversion layer according to claim 1, 2 or 3, wherein the step of forming a hydrogen-containing amorphous silicon layer is carried out by a glow discharge process in an atmosphere which contains at least silane.

6. A method of producing an image pickup device comprising the steps of forming a hydrogen-containing amorphous silicon layer on a predetermined substrate in a plasma atmosphere at a substrate temperature below 200° C., and subsequently heat-treating said hydrogen-containing amorphous silicon layer at 200° C.–400° C. without cooling the substrate.

7. A method of producing an image pickup device according to claim 6, wherein the heating step is carried out at a temperature of from 200° C. to 240° C.

8. A method of producing an image pickup device according to claim 6, wherein the heating step is carried out at a temperature of from 240° C. to 400° C.

9. A method of producing an image pickup device according to claim 6, 7 or 8, wherein the step of forming a hydrogen-containing amorphous silicon layer is carried out by a reactive sputtering in an atmosphere which contains at least hydrogen.

10. A method of producing an image pickup device according to claim 6, 7 or 8, wherein the step of forming a hydrogen-containing amorphous silicon layer is carried out by a glow discharge process in an atmosphere which contains at least silane.

* * * * *